US012701653B2

(12) United States Patent
Ko

(10) Patent No.: US 12,701,653 B2
(45) Date of Patent: Aug. 4, 2026

(54) PRINTED CIRCUIT BOARD

(71) Applicant: SAMSUNG ELECTRO-MECHANICS CO., LTD., Suwon-si (KR)

(72) Inventor: Joo Yul Ko, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 266 days.

(21) Appl. No.: 18/671,260

(22) Filed: May 22, 2024

(65) Prior Publication Data

US 2025/0081332 A1     Mar. 6, 2025

(30) Foreign Application Priority Data

Sep. 1, 2023    (KR) ........................ 10-2023-0116513

(51) Int. Cl.
*H05K 1/02*         (2006.01)
*H05K 1/183*        (2026.01)
(52) U.S. Cl.
CPC ........... *H05K 1/0296* (2013.01); *H05K 1/183* (2013.01)
(58) Field of Classification Search
CPC ...... H05K 1/0292; H05K 1/0296; H05K 1/11; H05K 1/181; H05K 1/183; H05K 2201/0979; H05K 2201/1053
See application file for complete search history.

(56) References Cited

U.S. PATENT DOCUMENTS

| | | | |
|---|---|---|---|
| 10,552,253 B2 | 2/2020 | Iyer et al. | |
| 2012/0014080 A1* | 1/2012 | Feng ..................... | G06F 30/392 174/268 |
| 2015/0034363 A1* | 2/2015 | Bingi ................... | G06F 13/409 174/250 |
| 2018/0020540 A1* | 1/2018 | Nakaminami ....... | G09G 3/3674 |
| 2019/0259737 A1 | 8/2019 | Song et al. | |

FOREIGN PATENT DOCUMENTS

KR          10-2395199 B1     5/2022

* cited by examiner

*Primary Examiner* — Nathan Milakovich
(74) *Attorney, Agent, or Firm* — Morgan, Lewis & Bockius LLP

(57)          ABSTRACT

A printed circuit board includes a first wiring portion including a plurality of first wirings, a first integrated circuit chip connected to one side of the first wiring portion, the first integrated circuit chip configured to convert N signals into one signal, where N is a natural number, a second integrated circuit chip connected to an opposite side of the first wiring portion, the second integrated circuit chip configured to convert one signal into N signals, a second-first wiring portion connected to the first integrated circuit chip, the second-first wiring portion including a plurality of second-first wirings, and a second-second wiring portion connected to the second integrated circuit chip, the second-second wiring portion including a plurality of second-second wirings. X and Y1 satisfy Y1/N<X, in which X is the number of the plurality of first wirings and Y1 is the number of the plurality of second-first wirings.

20 Claims, 15 Drawing Sheets

PRINTED CIRCUIT BOARD

CROSS-REFERENCE TO RELATED APPLICATION(S)

This application claims benefit of priority to Korean Patent Application No. 10-2023-0116513 filed on Sep. 1, 2023 in the Korean Intellectual Property Office, the disclosure of which is incorporated herein by reference in its entirety.

TECHNICAL FIELD

The present disclosure relates to a printed circuit board. Multichip packages including a memory chip such as a high bandwidth memory (HBM) and a processor chip such as a central processing portion (CPU), a graphics processing portion (GPU), an application specific integrated circuit (ASIC), or a field programmable gate array (FPGA) have been used to process data, which has been exponentially increasing due to recent developments in artificial intelligence (AI) technology. In addition, as the number of CPU and GPU cores of server products is rapidly increasing, chiplet technology capable of effectively increasing the number of cores has become common, and demand for a high-density circuit connecting a logic semiconductor and a memory semiconductor to each other, or connecting a logic semiconductor and a logic semiconductor to each other, has been also rapidly increasing. Thus, die-to-die interconnection has been required. Designing boards to enable die-to-die interconnection requires a technology for implementing fine circuits, and thus research has been conducted to implement high-density fine circuits implemented on large-area boards, improve reliability, and increase yield.

SUMMARY

An aspect of the present disclosure provides a printed circuit board capable of performing a normal function, even when a defect occurs.

Another aspect of the present disclosure provides a printed circuit board having improved yield, even when a fine wiring is implemented.

Another aspect of the present disclosure provides a printed circuit board having improved reliability.

According to an aspect of the present disclosure, there is provided a printed circuit board including a first wiring portion including a plurality of first wirings, a first integrated circuit chip connected to one side of the first wiring portion, the first integrated circuit chip configured to convert N signals into one signal (where N is a natural number), a second integrated circuit chip connected to an opposite side of the first wiring portion, the second integrated circuit chip configured to convert one signal into N signals, a second-first wiring portion connected to the first integrated circuit chip, the second-first wiring portion including a plurality of second-first wirings, and a second-second wiring portion connected to the second integrated circuit chip, the second-second wiring portion including a plurality of second-second wirings. X and Y1 may satisfy Y1/N<X, in which X is the number of the plurality of first wirings and Y1 is the number of the plurality of second-first wirings.

According to an aspect of the present disclosure, there is provided a printed circuit board including a first insulating portion including a plurality of first insulating layers, and a plurality of cavities respectively penetrating a portion of the plurality of first insulating layers, a first integrated circuit chip mounted in one cavity, among the plurality of cavities, the first integrated circuit chip including a demultiplexer (DEMUX) circuit, a second integrated circuit chip mounted in another cavity, among the plurality of cavities, the second integrated circuit chip including a multiplexer (MUX) circuit, a second insulating portion disposed across a portion of the first integrated circuit chip and a portion of the second integrated circuit chip, and a first wiring portion disposed on or in the second insulating portion, the first wiring portion connecting the first integrated circuit chip and the second integrated circuit chip to each other. The first wiring portion may include a plurality of first wirings. At least one wiring, among the plurality of first wirings, may be open, or at least two wirings, among the plurality of first wirings, may be shorted to each other, such that the open or shorted wirings do not serve as a path between the first integrated circuit chip and the second integrated circuit chip.

According to an aspect of the present disclosure, there is provided a printed circuit board including a first insulating portion including a plurality of first insulating layers, and a plurality of cavities respectively penetrating a portion of the plurality of first insulating layers, a first integrated circuit chip disposed in one cavity, among the plurality of cavities, a second integrated circuit chip disposed in another cavity, among the plurality of cavities, a second insulating portion disposed across a portion of the first integrated circuit chip and a portion of the second integrated circuit chip, and a wiring portion disposed on or in the second insulating portion, the wiring portion including a plurality of wirings to connect the first integrated circuit chip and the second integrated circuit chip to each other. Signal transmission between the first integrated circuit chip and the second integrated circuit chip is performed by bypassing a defective wiring among the plurality of wirings to a dummy wiring among the plurality of wirings through lane shifting.

According to example embodiments of the present disclosure, a printed circuit board may perform a normal function, even when a defect occurs.

The printed circuit board may have improved yield, even when a fine wiring is implemented.

The printed circuit board may have improved reliability.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
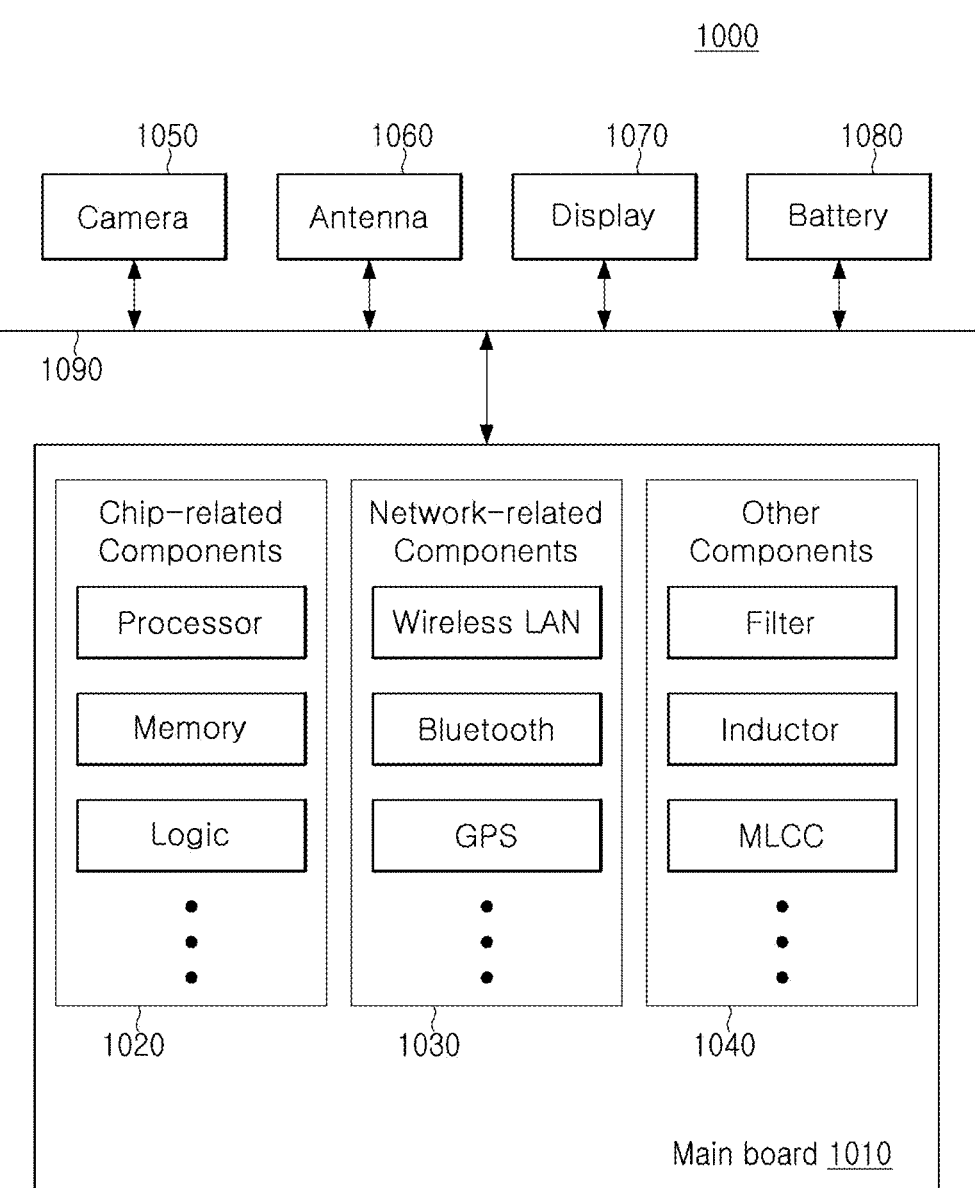
FIG. 1 is a schematic block diagram of an example of an electronic device system.

Hereinafter, the present disclosure will be described with reference to the accompanying drawings. The shapes and sizes of components in the drawings may be exaggerated or reduced for clearer description.

Electronic Device

FIG. 1 is a schematic block diagram of an example of an electronic device system.

Referring to FIG. 1, an electronic device 1000 may accommodate a mainboard 1010. The mainboard 1010 may include chip-related components 1020, network-related components 1030, and other components 1040, physically or electrically connected thereto. Such components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), or a flash memory, an application processor chip such as a central processor (for example, a central processing portion (CPU)), a graphics processor (for example, a graphics processing portion (GPU)), a digital signal processor, a cryptographic processor, a microprocessor, or a microcontroller, and a logic chip such as an m analog-to-digital converter or an application-specific integrated circuit (ASIC). However, the chip-related components 1020 are not limited thereto, and may include other types of chip-related components. In addition, the chip-related components 1020 may be combined with each other. The chip-related components 1020 may be in the form of a package including the above-described chip or electronic component.

The network-related components 1030 may include protocols such as wireless fidelity (Wi-Fi) (Institute of Electrical And Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the above-described protocols. However, the network-related components 1030 are not limited thereto, and may also include a variety of other wireless or wired standards or protocols. In addition, the network-related components 1030 may be combined with each other, together with the chip-related components 1020 described above.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, and may also include passive components used for various other purposes, or the like. In addition, the other components 1040 may be combined with each other, together with the chip-related components 1020 or the network-related components 1030 described above.

Depending on a type of the electronic device 1000, the electronic device 1000 may include other components that may be or may not be physically or electrically connected to the mainboard 1010. The other components may include, for example, a camera module 1050, an antenna module 1060, a display 1070, a battery 1080, and the like. However, the other components are limited thereto, and may be an audio codec, a video codec, a power amplifier, a compass, an accelerometer, a gyroscope, a speaker, a mass storage portion (for example, a hard disk drive), a compact disk (CD), a digital versatile disk (DVD), or the like. In addition, the other components may also include other components used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device to process data.

Figure 2:
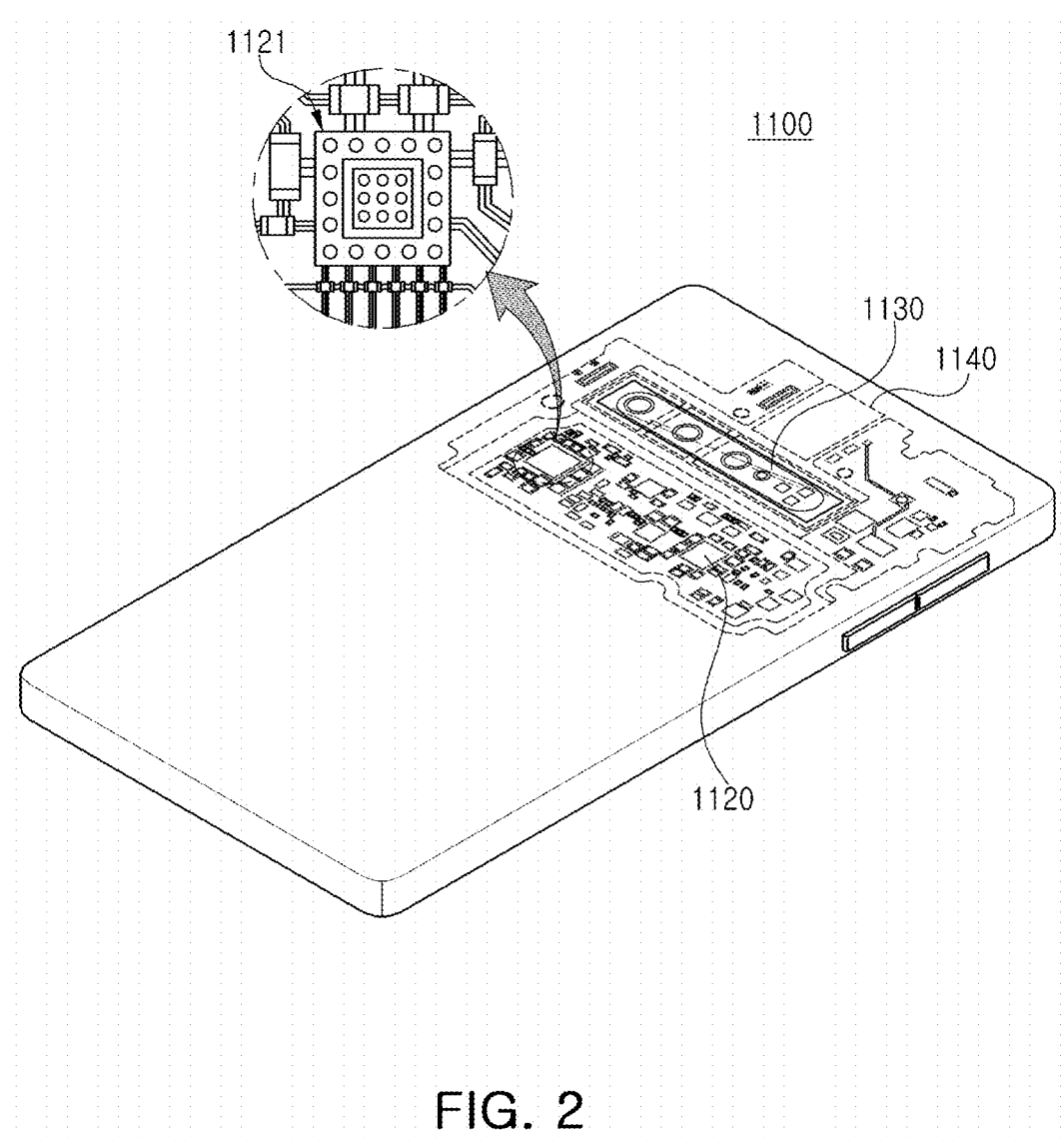
FIG. 2 is a schematic perspective view of an example of an electronic device.

FIG. 2 is a schematic perspective view of an example of an electronic device.

Referring to FIG. 2, an electronic device may be, for example, a smartphone 1100. The motherboard 1110 may be accommodated in the smartphone 1100, and various electronic components 1120 may be physically and/or electrically connected to the motherboard 1110. In addition, other electronic components that may be or may not be physically and/or electrically connected to the motherboard 1110 may be accommodated therein, such as a camera module 1130 and/or a speaker 1140. A portion of the electronic components 1120 may be the chip-related components described above, for example, a component package 1121, but the present disclosure is not limited thereto. The component package 1121 may be in the form of a printed circuit board on which electronic components including active components and/or passive components are surface-mounted. The electronic device is not necessarily limited to the smartphone 1100, and may be other electronic devices, as described above.

Printed Circuit Board

Figure 3:
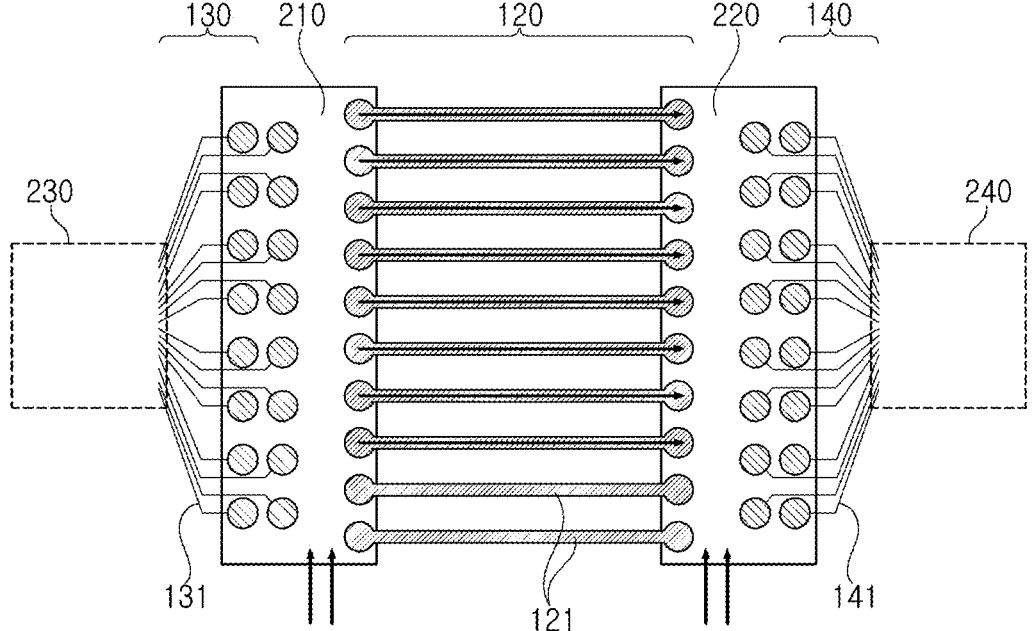
FIG. 3 is a schematic plan view of a portion of a printed circuit board according to an example.
Figure 4:
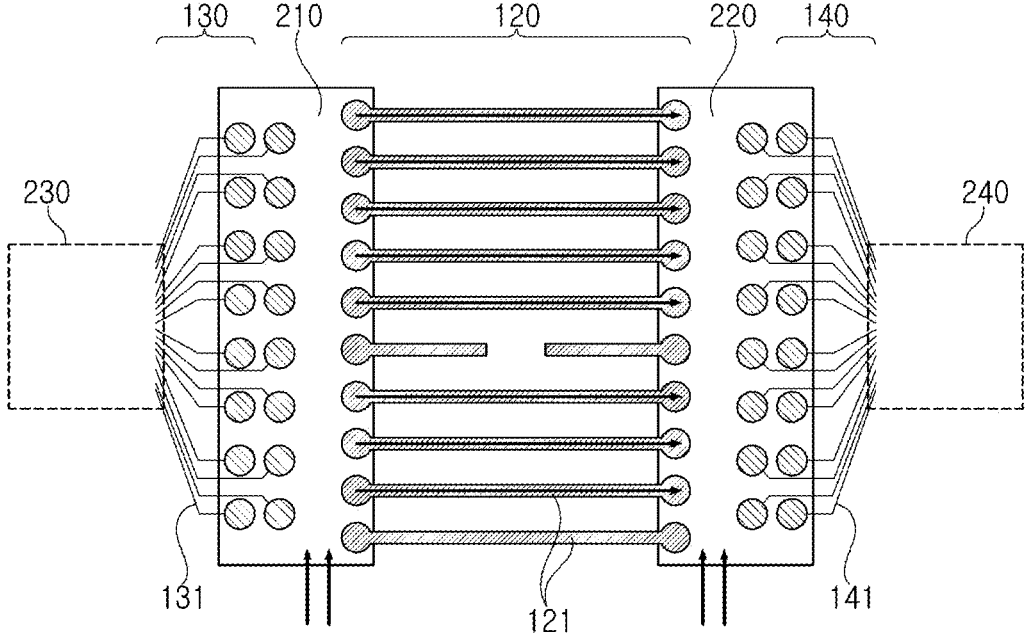
FIG. 4 is a schematic plan view of a modification of a printed circuit board according to an example.

FIG. 3 is a schematic plan view of a portion of a printed circuit board according to an example. FIG. 4 is a schematic plan view of a modification of a printed circuit board according to an example.

Referring to FIG. 3, a semiconductor package according to an example may include a first insulating portion 110 (shown, for example, in FIGS. 6A and 6B), a first wiring portion 120 disposed on or in the first insulating portion 110, the first wiring portion 120 including a plurality of first wirings 121, a first integrated circuit chip 210 connected to one side of the first wiring portion 120, a second integrated circuit chip 220 connected to an opposite side of the first wiring portion 120, a second-first wiring portion 130 having one side connected to the first integrated circuit chip 210, the second-first wiring portion 130 including a plurality of second-first wirings 131, and a second-second wiring portion 140 having one side connected to the second integrated circuit chip 220, the second-second wiring portion 140 including a plurality of second-second wirings 141.

The printed circuit board according to an example may include a first integrated circuit chip 210, and a second integrated circuit chip 220 disposed on the first insulating portion 110. The first integrated circuit chip 210 and the second integrated circuit chip 220 may respectively include an integrated circuit (IC) in which hundreds to millions of circuits are integrated into a single chip.

The first integrated circuit chip 210 may include a demultiplexer (DEMUX) circuit converting N signals (where N is a natural number) into one signal, and the second integrated circuit chip 220 may include a multiplexer (MUX) circuit converting one signal into N signals (where N is a natural number). The demultiplexer circuit, an inverse multiplexing circuit, may refer to a circuit converting a plurality of signal paths into one signal path and transmitting a signal using a method such as time delay control or the like. The multiplexer circuit, a multiplexing circuit, may convert one signal path into a plurality of signal paths and transmit a signal using a method such as time delay control or the like. In this case, N presented in a ratio of N:1 of the demultiplexer circuit included in the first integrated circuit chip 210 may not correspond to N presented in a ratio of 1:N of the multiplexer circuit included in the second integrated circuit chip 220.

The first integrated circuit chip 210 may transmit, to the first wiring portion 120, a signal input through the second-first wiring portion 130 using demultiplexing. In this case, the first integrated circuit chip 210 may select each transmission signal path. That is, an integrated circuit of the first integrated circuit chip 210 may select a wiring to be used, among the plurality of first wirings 121, and may be set not to use a pad connected to an open wiring.

The second integrated circuit chip 220 may transmit, to the second-second wiring portion 140, a signal input through the first wiring portion 120 using multiplexing. In this case, the second integrated circuit chip 220 may receive a signal through a pad connected to the first wiring portion 120.

Figure 6A:
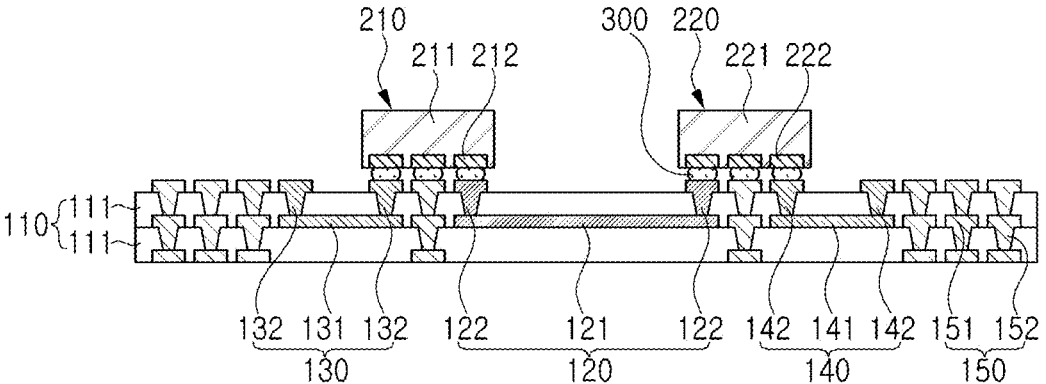
FIGS. 6A and 6B are schematic cross-sectional views of a printed circuit board according to an example.

The first integrated circuit chip 210 and the second integrated circuit chip 220 may operate separately from the first semiconductor chip 230 and the second semiconductor chip 240, such that the first semiconductor chip 230 and the second semiconductor chip 240 may inspect and correct defects in the first wiring 121 in a state in which the first integrated circuit chip 210 and the second integrated circuit chip 220 are mounted, as illustrate in FIG. 6A. In this case, I2C communication may be used as a method of externally controlling the first integrated circuit chip 210 and the second integrated circuit chip 220 so as to correct the defective first wiring 121, but the present disclosure is not limited thereto. Any communication method of controlling an integrated circuit, such as SPI communication, may be used without limitation. In this case, I2C communication capable of performing control without using an internal clock may be preferably used.

The second-first wiring portion 130 may be an input portion input to the first integrated circuit chip 210, and the first wiring portion 120 may be an output portion of the first integrated circuit chip 210. In addition, the first wiring portion 120 may be an input portion of the second integrated circuit chip 220, and the second-second wiring portion 140 may be an output portion of the second integrated circuit chip 220.

In this case, when the number of the plurality of first wirings 121 is X, the number of the plurality of second-first wirings 131 is Y1, and the number of the plurality of second-second wirings 141 is Y2, Y1/N<X may be satisfied, and Y2/N<X may be satisfied. Satisfying that the number of the plurality of first wirings 121 is greater than the number of input signals converted through the first integrated circuit chip 210, with respect to the first integrated circuit chip 210. That is, in a process of a transmitting signal of the printed circuit board that is input through the second-first wiring portion 130 and output to the second-second wiring portion 140 through the first wiring portion 120, the plurality of first wirings 121 of the first wiring portion 120 may include a greater number of wirings than the required number of wirings. In this case, a greater number of wirings may function as a dummy, that is, a dummy lane. In this case, the number of dummy lanes may be X-Y1/N, or may be X-Y2/N.

Numerous defects may occur in an operation of manufacturing the printed circuit board. One of the defects may be an open phenomenon. The open phenomenon may be based on a concept including a state in which a wiring is cut off or a state in which a wiring has excessively high resistance, and may mean a state in which two components are not electrically connectable to each other. That is, a process of patterning a wiring may include an operation of removing at least a portion of a metal included in the wiring. In this case, a portion of the metal that needs to be connected to the wiring may be removed, resulting in an open defect. In general, when an open phenomenon occurs during wiring patterning, a printed circuit board may have a defect, and thus may not perform a function thereof. However, the printed circuit board according to an example may include a greater number of first wirings 121 than necessary. Accordingly, even when an open phenomenon occurs in one of the first wirings 121, the wiring in which the open phenomenon occurs may be redisposed with another extra wiring. In other words, signal transmission may be performed by bypassing the defective wiring to another wiring using lane shifting. In this case, lane shifting may be performed by immediately changing a defective lane to a dummy lane, rather than sequentially changing the defective lane to a subsequent lane one by one.

FIG. 3 illustrates the first wiring portion 120 in which an open phenomenon has not occurred, and FIG. 4 is a plan view of the first wiring portion 120 in which an open phenomenon has occurred. As a non-limiting specific example, it is illustrated that the first integrated circuit chip 210 performs 1:2 signal conversion, and the second integrated circuit chip 220 performs 2:1 signal conversion. The number of input signals input to the first integrated circuit chip 210 and output signals output through the second integrated circuit chip 220 is illustrated as 16. In addition, the number of the plurality of first wirings 121 of the first wiring portion 120 is illustrated as 10. That is, as illustrated in FIGS. 3 and 4, X may be 10, Y1 and Y2 may be 16, and N may be 2, Y1/N<X may be satisfied, and Y2/N<X may be satisfied. However, such a configuration is merely an example, and the number of signals and wirings is not limited thereto. As illustrated in FIG. 3, the number of first wirings 121 required in the first wiring portion 120 may be 8, but the number of the plurality of first wirings 121 may be implemented as 10, such that two first wirings 121 may be dummy lanes.

Referring to FIG. 4, at least one wiring, among the plurality of first wirings 121, may be open. As at least one wiring, among the plurality of first wirings 121, is open, the first integrated circuit chip 210 and the second integrated circuit chip 220 may not be connected to each other through the open wiring. That is, the open wiring may not electrically connect the first integrated circuit chip 210 and the second integrated circuit chip 220 to each other. This may be because a defect occurs due to an open phenomenon in an operation of implementing the first wiring 121, among operations of manufacturing the printed circuit board. However, the defect may be dealt with by bypassing the open wiring to a dummy lane using the first integrated circuit chip 210 and the second integrated circuit chip 220. In this case, the first integrated circuit chip 210 and the second integrated circuit chip 220 may be designed to use a dummy lane without using the defective wiring. However, the present disclosure is not limited thereto, and lane shifting may be performed by skipping the defective wiring and sequentially connecting a subsequent wiring. The printed circuit board according to an example may detect a defect occurring in the first wiring portion 120 before the first semiconductor chip 230 and the second semiconductor chip 240 are mounted, such that it may be more advantageous to design the printed circuit board to bypass the defective wiring directly to a dummy lane, rather than to move the defective wiring one by one to each adjacent wiring, using the first semiconductor chip 230 and the second semiconductor chip 240.

In this case, when the number of open wirings, among the plurality of first wirings 121, is Z, $Y1/N \leq X-Z$ and $Y2/N \leq X-Z$ may be satisfied. That is, the printed circuit board may be designed to include a greater number of dummy lanes than the number of wirings having a defect caused by an open phenomenon. That is, when a dummy lane is designed in a design operation, a normal operation may be performing using lane shifting to the dummy lane, even when a certain number of defects occur. When a wiring defect occurs in a general printed circuit board, the printed circuit board may not perform a function thereof, and thus may be discarded. However, in the printed circuit board according to an example, even when a defect occurs, a defective wiring may be bypassed into a dummy lane, such that the occurrence of a certain level of defect may not be recognized as a defect occurring in the entire printed circuit board. That is, even when a defect occurs in a portion of the first wiring portion 120, the entire printed circuit board may not be defective, and thus may operate as a fair-quality printed circuit board. Accordingly, the printed circuit board may have improved yield.

Figure 5:
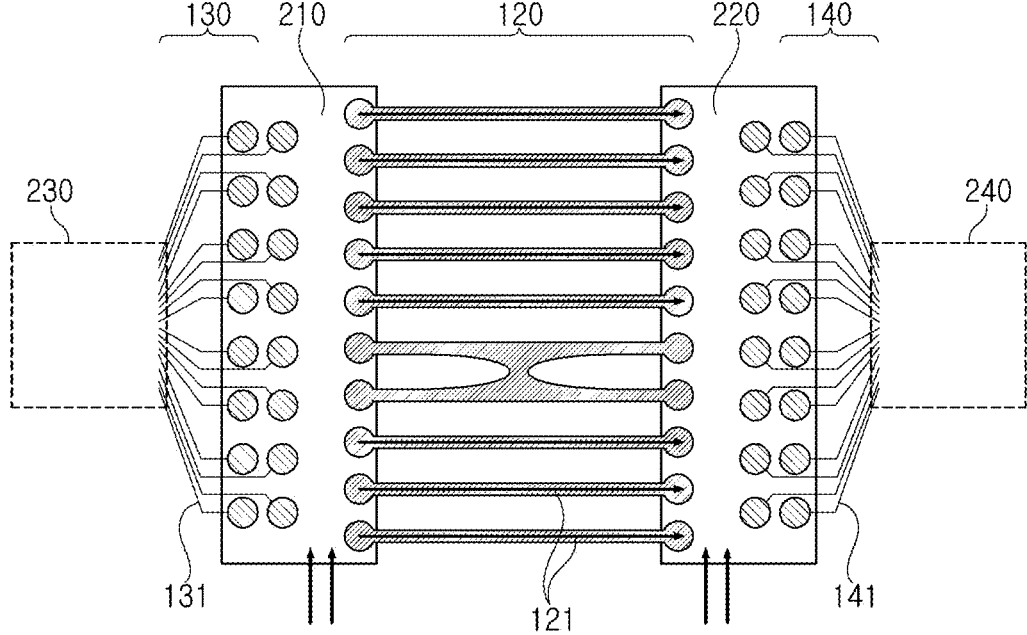
FIG. 5 is a schematic plan view of a modification of a printed circuit board according to an example.

Referring to FIG. 5, at least two wirings, among the plurality of first wirings 121 of the first wiring portion 120, may be shorted to each other. As at least two wirings, among the plurality of first wirings 121, are shorted to each other, the first integrated circuit chip 210 and the second integrated circuit chip 220 may not exchange an electrical signal due to the shorted wirings. That is, the first integrated circuit chip 210 and the second integrated circuit chip 220 may not be electrically connected to each other due to the shorted wirings. In this case, the first integrated circuit chip 210 and the second integrated circuit chip 220 being not connected to each other may mean a state in which electrical signal transmission from the first integrated circuit chip 210 to the second integrated circuit chip 220 cannot be performed and the shorted wirings cannot serve as the path between the first integrated circuit chip 210 and the second integrated circuit chip 220, rather than the first integrated circuit chip 210 and the second integrated circuit chip 220 being not physically connected to each other. That is, a short circuit phenomenon may be a phenomenon in which a defect occurs in an operation of manufacturing the printed circuit board. However, the printed circuit board according to an example may deal with the defect by respectively bypassing the two shorted wirings into different dummy lanes, using the first integrated circuit chip 210 and the second integrated circuit chip 220. In this case, the first integrated circuit chip 210 and the second integrated circuit chip 220 may be designed to use the dummy lanes without using defective wirings. However, the present disclosure is not limited thereto, and lane shifting may be performed by skipping the defective wirings and sequentially connecting a subsequent wiring. The printed circuit board according to an example may detect a defect occurring in the first wiring portion 120 before the first semiconductor chip 230 and the second semiconductor chip 240 are mounted, such that it may be more advantageous to design the printed circuit board to bypass the defective wiring directly to a dummy lane, rather than to move the defective wiring one by one to each adjacent wiring, using the first semiconductor chip 230 and the second semiconductor chip 240.

With respect to a defect caused by a short circuit, the number of dummy lanes may be designed to be greater than the number of wirings in which a short circuit occurs, in the same manner as a defect caused by an open phenomenon. That is, when the number of wirings in which a short circuit occurs is Z, $Y1/N \leq X-Z$ and $Y2/N \leq X-Z$ may be satisfied, as described above. A short circuit may occur between at least two different wirings, among the plurality of first wirings 121, and thus Z may be greater than or equal to 2. In this case, a short circuit may not occur only in one portion, but two or more short circuits may respectively occur, or a defect may occur in which three or more first wirings 121 are shorted to each other.

A wiring defect in the printed circuit board is not limited to that illustrated in FIG. 4 or FIG. 5, and may further vary. For example, the defect caused by an open phenomenon illustrated in FIG. 4 and the defect caused by a short circuit illustrated in FIG. 5 may occur simultaneously. As another example, the wiring defect may occur in various manners, such as an increase in resistance caused by impurities or a defect in some wirings caused by undulation. However, the present disclosure is not limited thereto, and there may be a defect occurring when the first wiring portion 120 is connected to the first integrated circuit chip 210 and/or the second integrated circuit chip 220, such as a defect in a via connected to a wiring, a defect occurring during soldering, or the like. That is, with respect to various defects, the defects may be overcome by changing a wiring to a dummy lane, as described above, and a fair-quality printed circuit board may be provided.

The printed circuit board according to an example may control the defect caused by an open phenomenon, even in an operation before the first semiconductor chip 230 and the second semiconductor chip 240 are mounted. For example, in a general printed circuit board and package, the defect may be generally controlled after all semiconductor chips are mounted. However, in the printed circuit board according to an example, the defect may be controlled, even in an operation before the first semiconductor chip 230 and the second semiconductor chip 240 are mounted. A defect in a wiring may be inspected in a state in which the first integrated circuit chip 210 and the second integrated circuit chip 220 are mounted, and another wiring may be used using the first integrated circuit chip 210 and the second integrated circuit chip 220 depending on an inspection result, thereby improving a degree of design freedom for a semiconductor chip. That is, in a general case, a semiconductor chip having a lane shifting function may need to be used, and a correction operation may be included through the semiconductor chip. Conversely, the printed circuit board according to an example may freely use the first wiring 121 regardless of the semiconductor chip. Accordingly, power consumption may not be necessary, and a wiring defect in the printed circuit board may be overcome before the semiconductor chip is mounted. That is, unlike the general printed circuit board or semiconductor package, the printed circuit board according to an example may control a defective wiring, even when the first semiconductor chip 230 and the second semiconductor chip 240 are not mounted. That is, as illustrated in FIGS. 3 and 4, even when the first semiconductor chip 230 and the second semiconductor chip 240 are not included, quality inspection of the printed circuit board according to an example may be completed, and the printed circuit board may function as a printed circuit board.

In the printed circuit board according to an example, the first semiconductor chip 230 and the second semiconductor chip 240 may be electrically connected to each other, and may have a signal path leading in an order of the second-first wiring portion 130, the first integrated circuit chip 210, the first wiring portion 120, the second integrated circuit chip 220, the second-second wiring portion 140, and the second semiconductor chip 240. The signal path may be confirmed by analyzing, one by one, surfaces of each layer of the completed printed circuit board. That is, whether the second-first wiring portion 130 and the second-second wiring portion 140 are respectively connected may be confirmed by removing, one by one, surfaces of an upper layer of the first connection portion 120 connected to the first integrated circuit chip 210 and the second integrated circuit chip 220, before the first semiconductor chip 230 and the second semiconductor chip 240 are connected to each other or in a state in which the first semiconductor chip 230 and the second semiconductor chip are removed. The above-described process may be repeatedly performed to confirm that the signal path has been formed. The present disclosure is not limited thereto, and any other method of analyzing a signal path may be used without limitation.

FIGS. 3 and 4 illustrate connection between wirings of the first integrated circuit chip 210 and the second integrated circuit chip 220 with respect to the first wiring portion 120 of the printed circuit board. In the printed circuit board, an arrangement relationship between the first integrated circuit chip 210 and the second integrated circuit chip 220, and an arrangement relationship between the first wiring portion 120, the second-first wiring portion 130, and the second-second wiring portion 140 may vary. Hereinafter, the arrangement relationships will be described in detail using a cross-sectional view.

Figure 6B:
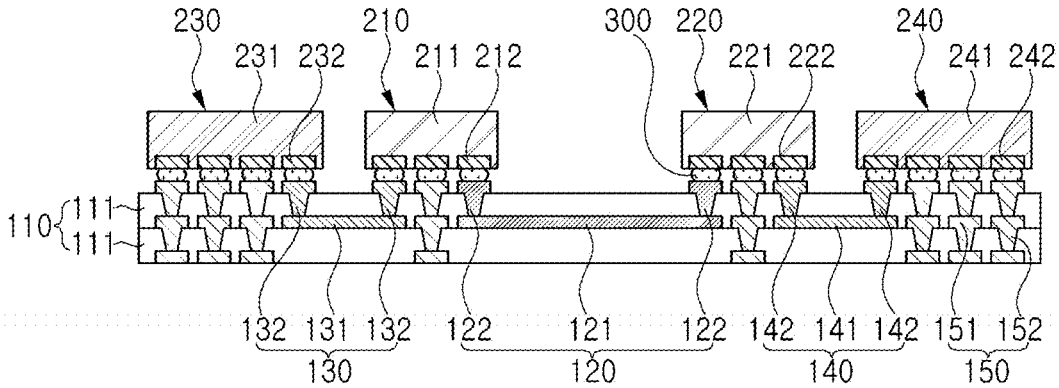

FIGS. 6A and 6B are schematic cross-sectional views of a printed circuit board according to an example.

The first insulating portion 110 may include a plurality of first insulating layers 111, and each of the first insulating layers 111 may include an insulating material. The insulating material may include a thermosetting resin such as an epoxy resin, a thermoplastic resin such as polyimide, or a material including an inorganic filler, an organic filler, and/or a glass fiber (glass cloth, and/or glass fabric), together with the above-described resins. The insulating material may be a photosensitive material and/or a non-photosensitive material. For example, the insulating material of the first insulating layer 111 may be an insulating material of prepreg (PPG) or resin coated copper (RCC), but the present disclosure is not limited thereto, and may be an Ajinomoto Build-up Film (ABF), photoimageable dielectric (PID), FR-4, bismaleimide triazine (BT), or the like. However, the present disclosure is not limited thereto, and other materials having excellent rigidity may be used, as necessary. The first insulating layer 111 may include an insulating layer as a core layer.

The first wiring portion 120 disposed on or in the first insulating portion 110 may include a plurality of first wirings 121 and a plurality of first vias 122. Each of the plurality of first wirings 121 and the plurality of first vias 122 may include a metal material. The metal material may include copper (Cu), aluminum (Al), silver (Ag), tin (Sn), gold (Au), nickel (Ni), lead (Pb), titanium (Ti), and/or alloys thereof. The wiring layer 121 may include an electroless plating layer (or chemical copper) as a seed layer, and an electrolytic plating layer (or electrolytic copper) as a plating layer, but the present disclosure is not limited thereto. A sputtering layer may be formed instead of chemical copper as an electroless plating layer. Copper foil may be further included, as necessary.

The first wiring 121 and the first via 122 may respectively perform various functions depending on a design of a corresponding layer. For example, a ground pattern/via, power pattern/via, signal pattern/via, and the like may be included. Here, the signal pattern/via may include a pattern/via for transmitting various signals, for example, a data signal and the like, other than ground pattern/via, power pattern/via, and the like. The above-described patterns may respectively include a line pattern, a plane pattern, and/or a pad pattern.

The first via 122 may include a micro via. The micro via may be a filled via filling a via hole, or a conformal via disposed along a wall surface of the via hole. The micro via may be disposed as a stacked-type via and/or a staggered-type via.

The first wiring 121 and the first via 122 may be formed integrally with each other, but the present disclosure is not limited thereto. The first wiring 121 and/or the first via 122 may be formed using one of a semi-additive process (SAP), a modified semi-additive process (MSAP), tenting (TT), or a subtractive process, but the present disclosure is not limited thereto, and any method capable of forming a circuit in a printed circuit board may be used without limitation.

The second-first wiring portion 130 and the second-second wiring portion 140 may also be disposed on or in the first insulating portion 110, and may respectively include a second-first wiring 131 and a second-first via 132, and a second-second wiring 141 and a second-second via 142. The second-first wiring portion 130 and the second-second wiring portion 140 may be connected to the first integrated circuit chip 210 and the second integrated circuit chip 220, respectively. In addition, the first semiconductor chip 230 and the second semiconductor chip 240 may be connected to opposite sides of the second-first wiring portion 130 and the second-second wiring portion 140, respectively.

The second-first wiring 131 and the second-second wiring 141, included in the second-first wiring portion 130 and the second-second wiring portion 140, may respectively have features the same as those of the first wiring 121, but the present disclosure is not necessarily limited thereto, and may have features different from those of the first wiring 121. Similarly, the second-first via 132 and the second-second via 142 may respectively have features the same as those of the first via 122.

The printed circuit board according to an example may further include a third wiring portion 150 disposed on or in the first insulating portion 110. The third wiring portion 150 may be connected to the first integrated circuit chip 210 and the second integrated circuit chip 220, and may also be connected to the first semiconductor chip 230 and the second semiconductor chip 240. The third wiring portion 150 may include a third wiring 151 and a third via 152, and the third wiring 151 and the third via 152 may respectively have features the same as those of the first wiring 121 and the first via 122, but the present disclosure is not necessarily limited thereto. The third wiring portion 150 may be distinguished from the first wiring portion 120, the second-first wiring portion 130, and the second-second wiring portion 140 in that the third wiring portion 150 is configured to connect two components, among the first semiconductor chip 230, the second semiconductor chip 240, the first integrated circuit chip 210, and the second integrated circuit chip 220, to each other.

The first integrated circuit chip 210 and the second integrated circuit chip 220 may include bodies 211 and 221 and pads 212 and 222, respectively. An integrated circuit may be implemented in the bodies 211 and 221, and may be mounted on the printed circuit board through the pads 212 and 222. With respect to features of the first integrated circuit chip 210 and the second integrated circuit chip 220, the above description may be applied, and thus a repeated description will be omitted.

The printed circuit board according to an example may include a connection member 300 connecting the first integrated circuit chip 210, the first wiring portion 120, the second-first wiring portion 130, and the third wiring portion 150 to each other, or connecting the second integrated circuit chip 220, the first wiring portion 120, the second-second wiring portion 140, and the third wiring portion 150 to each other. The connection member 300 may be formed of a conductive material, for example, solder, but the material of the connection member 300 is not particularly limited thereto. In addition, a connection method of the connection member 300 is not limited thereto, and may include a land, a ball, a pin, and the like. In addition, the connection member 300 may be formed of multiple layers or a single layer. When formed of multiple layers, the connection member 300 may include a copper pillar and solder. When formed of a single layer, the connection member 300 may include tin-silver solder or copper, but the present disclosure is not limited thereto. The number and arrangement of the connection members 300, and a distance between the connection members 300 are not particularly limited, and may be sufficiently modified by those skilled in the art depending on a design thereof.

The first integrated circuit chip 210 and the second integrated circuit chip 220, including above-described circuits, may be used without limitation, may have other functions, and may have a function of a controller, a processor, or a memory in the same manner as other semiconductor chips.

Referring to FIG. 6B, the printed circuit board according to an example may further include a first semiconductor chip 230 and a second semiconductor chip 240.

The first semiconductor chip 230 and the second semiconductor chip 240 may be integrated circuits (ICs) in which hundreds to millions of circuits are integrated into a single chip. Each of the ICs may be a processor chip, specifically, an application processor (AP), such as a central processor (for example, a CPU), a graphics processing portion (for example, a GPU), a field programmable gate array (FPGA), a digital signal processor, a cryptographic processor, a microprocessor, or a microcontroller, but the present disclosure is not limited thereto, and may be a logic chip such as an analog-digital converter or an application-specific (ASIC) memory controller (MC) chip, or may be a memory chip such as a dynamic random access memory (DRAM) chip such as a static random access memory (SRAM) chip, a flash memory chip, a phase-change random access memory (PRAM) chip, a magnetic random access memory (MRAM)

chip, a resistive random access memory (RRAM) chip, an electrically erasable and programmable read-only memory (EEPROM) chip, or a high bandwidth memory (HBM) chip, and the above-described chips may be disposed in combination with each other.

The first semiconductor chip 230 and the second semiconductor chip 240 may respectively include bodies 231 and 241 and pads 232 and 242. Surfaces of the first semiconductor chip 230 and the second semiconductor chip 240 on which the pads 232 and 242 for connection to a wiring portion of the printed circuit board are disposed may be active surfaces, and opposite surfaces of the first semiconductor chip 230 and the second semiconductor chip 240 may be inactive surfaces, but the present disclosure is limited thereto. The first semiconductor chip 230 and the second semiconductor chip 240 may be respectively formed based on an active wafer. In this case, silicon (Si), germanium (Ge), gallium arsenide (GaAs), or the like may be used as a base material included in the bodies 231 and 241. Various circuits may be formed in the first semiconductor chip 230 and the second semiconductor chip 240.

The first semiconductor chip 230 may be connected to each of the second-first wiring portion 130 and the third wiring portion 150 through the connection member 300, and the second semiconductor chip 240 may be connected to each of the second-second wiring portion 140 and the third wiring portion 150 through the connection member 300.

The wiring portions of the printed circuit board according to an example may be connected to each other such that a signal path therebetween has a shortest distance. In particular, a path between the second-first wiring portion 130 and the second-second wiring portion 140 may be preferably implemented as a shortest path. That is, the first semiconductor chip 230 and the first integrated circuit chip 210 may be preferably connected to each other to have a shortest path therebetween, and the second integrated circuit chip 220 and the second semiconductor chip 240 may be preferably connected to each other to have a shortest path therebetween, but the present disclosure is not necessarily limited thereto. The first integrated circuit chip 210 and the second integrated circuit chip 220 may correct a defect occurring in the first wiring portion 120. Accordingly, the first semiconductor chip 230 and the first integrated circuit chip 210 may be connected to each other to have a shortest path therebetween, and the second semiconductor chip 240 and the second integrated circuit chip 220 may be connected to each other to have a shortest path therebetween, thereby reducing a defect rate.

The printed circuit board according to an example is not limited to the components illustrated in FIGS. 6A and 6B. In particular, a lower portion of the first insulating portion 110 may further include other insulating layers and wiring layers, and FIGS. 6A and 6B illustrate only an upper side of the printed circuit board, and may further include a general component of the printed circuit board. For example, the printed circuit board according to an example may further include a solder resist layer. That is, the printed circuit board may further include a component that could be used by those skilled in the art.

Figure 7A:
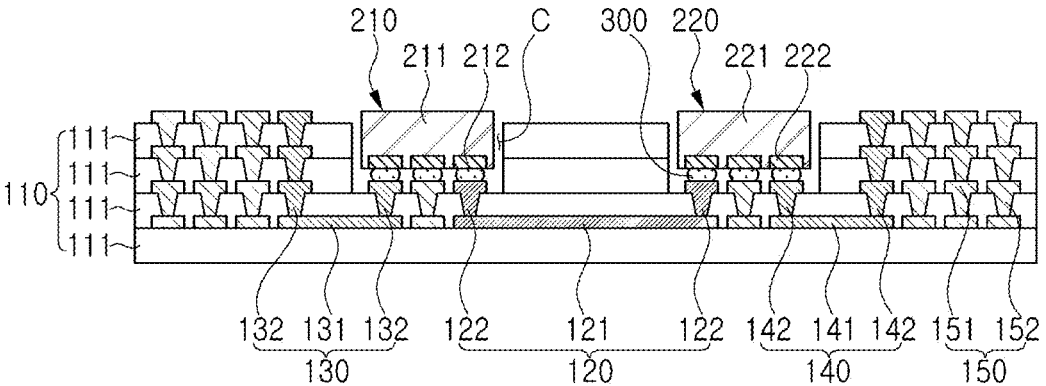
FIGS. 7A and 7B are schematic cross-sectional views of a printed circuit board according to another example.
Figure 7B:
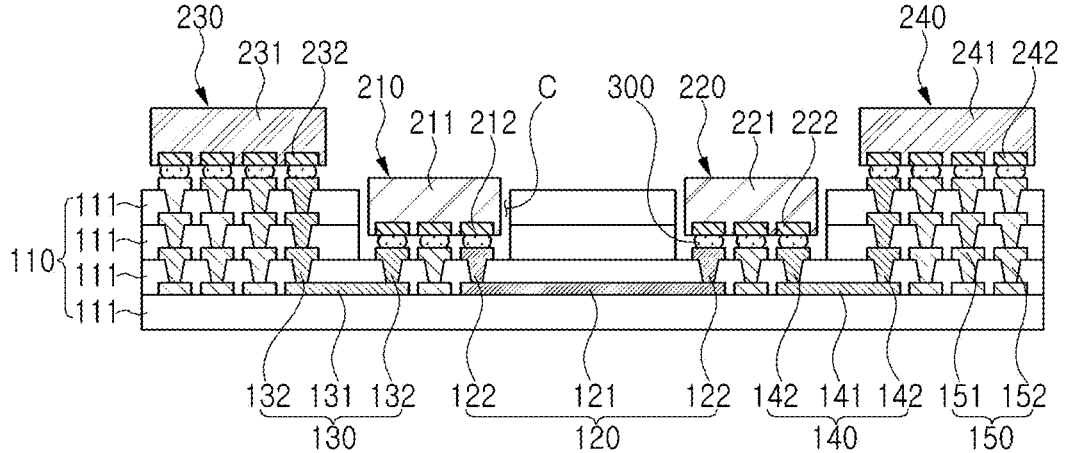

FIGS. 7A and 7B are schematic cross-sectional views of a printed circuit board according to another example.

Referring to FIGS. 7A and 7B, a first insulating portion 110 may further include a cavity C penetrating at least a portion of a plurality of first insulating layers 111. It is illustrated that the cavity C penetrates at least some first insulating layers 111, among the plurality of first insulating layers 111, but the present disclosure is not limited thereto, and the cavity C may penetrate only a portion of one insulating layer. A known method of forming the cavity C may be used. Various methods of forming the cavity C may be used, such that a shape of the cavity C may vary. A first integrated circuit chip 210 and a second integrated circuit chip 220 may be respectively mounted in the cavity C.

A configuration of the printed circuit board according to an example, excluding the cavity C, may be applied to the printed circuit board according to another example, and thus a repeated description related thereto will be omitted.

Figure 8A:
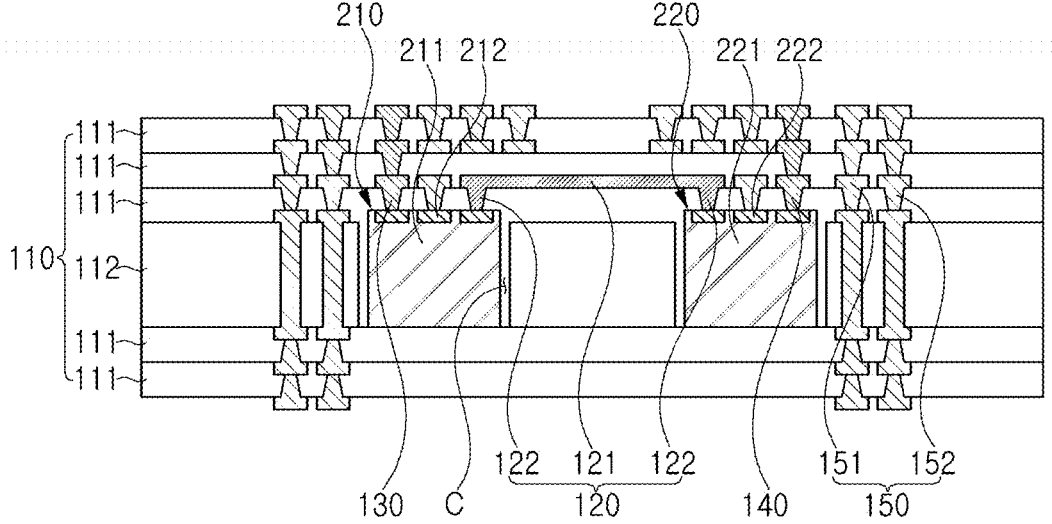
FIGS. 8A and 8B are schematic cross-sectional views of a printed circuit board according to another example.
Figure 8B:
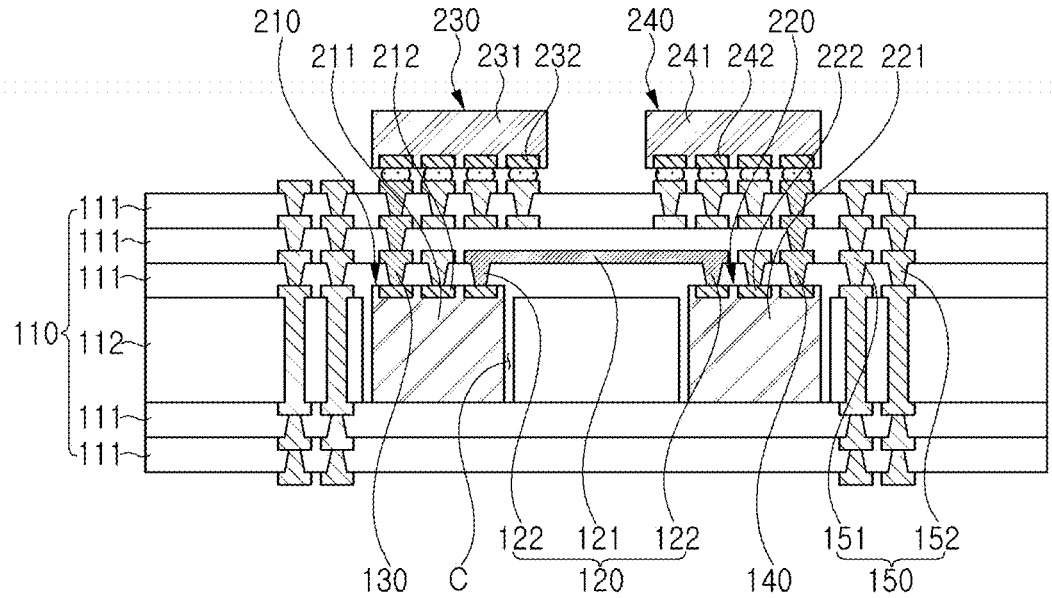

FIGS. 8A and 8B are schematic cross-sectional views of a printed circuit board according to another example.

Referring to FIGS. 8A and 8B, a first insulating portion 110 may further include a core 112. The core 112 may include a material including an inorganic filler, an organic filler, and/or a glass fiber (glass cloth, and/or glass fabric), together with a resin, and may be an insulating material such as prepreg (PPG), resin coated copper (RCC), copper clad laminate (CCL), or the like, but the present disclosure is not limited thereto. In this case, the core 112 may be thicker than a first insulating layer 111. In addition, the core 112 may include a cavity C.

A first integrated circuit chip 210 and a second integrated circuit chip 220 may be respectively mounted in the cavity C, and may be respectively connected through a via. That is, the first integrated circuit chip 210 and the second integrated circuit chip 220 may be connected to a first wiring 121 through a first via 122. In addition, the first integrated circuit chip 210 may be connected to each of a second-first via 132 and a third via 152, and the second integrated circuit chip 220 may be connected to each of a second-second via 142 and the third via 152. In this case, a first semiconductor chip 230 may be disposed directly on the first integrated circuit chip 210. In this case, it may be advantageous to connect the first semiconductor chip 230 and the first integrated circuit chip 210 to each other such that the first semiconductor chip 230 and the first integrated circuit chip 210 have a shortest path therebetween. The first semiconductor chip 230 and the first integrated circuit chip 210 may be connected to each other through the second-first via 132. In this case, the second-first via 132 may have a stacked-type via structure, thereby connecting the first semiconductor chip 230 and the first integrated circuit chip 210 to each other such that the first semiconductor chip 230 and the first integrated circuit chip 210 have a shortest path therebetween. A second semiconductor chip 240 and the second integrated circuit chip 220 may also have the same arrangement, but the present disclosure is not necessarily limited thereto.

A configuration of the printed circuit board according to an example and a configuration of the printed circuit board according to another example, excluding arrangements of the first insulating portion 110, the first integrated circuit chip 210, and the second integrated circuit chip 220, and connection between the first insulating portion 110, the first integrated circuit chip 210, and the second integrated circuit chip 220, may be applied to the printed circuit board according to another example, and thus a repeated description related thereto will be omitted.

Figure 9A:
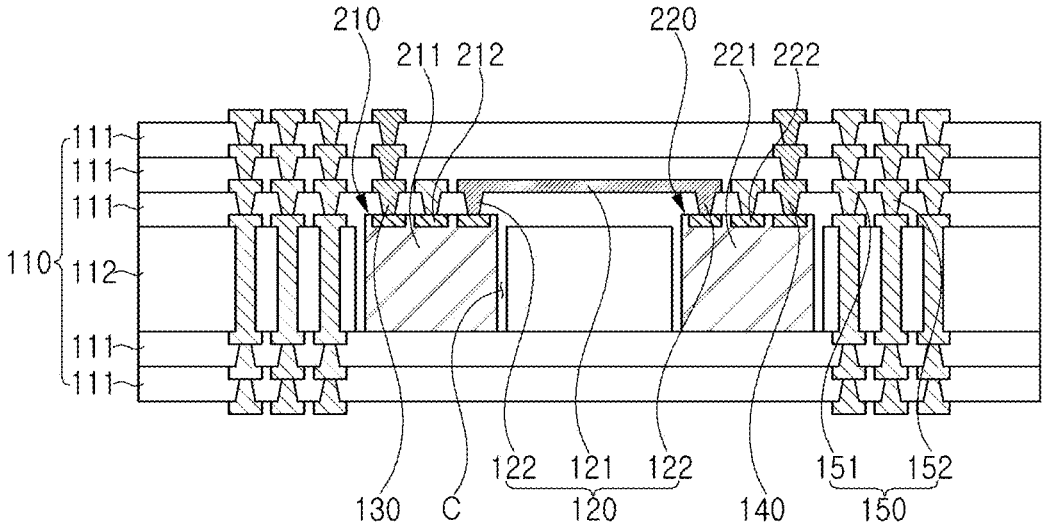
FIGS. 9A and 9B are schematic cross-sectional views of a printed circuit board according to another example.
Figure 9B:
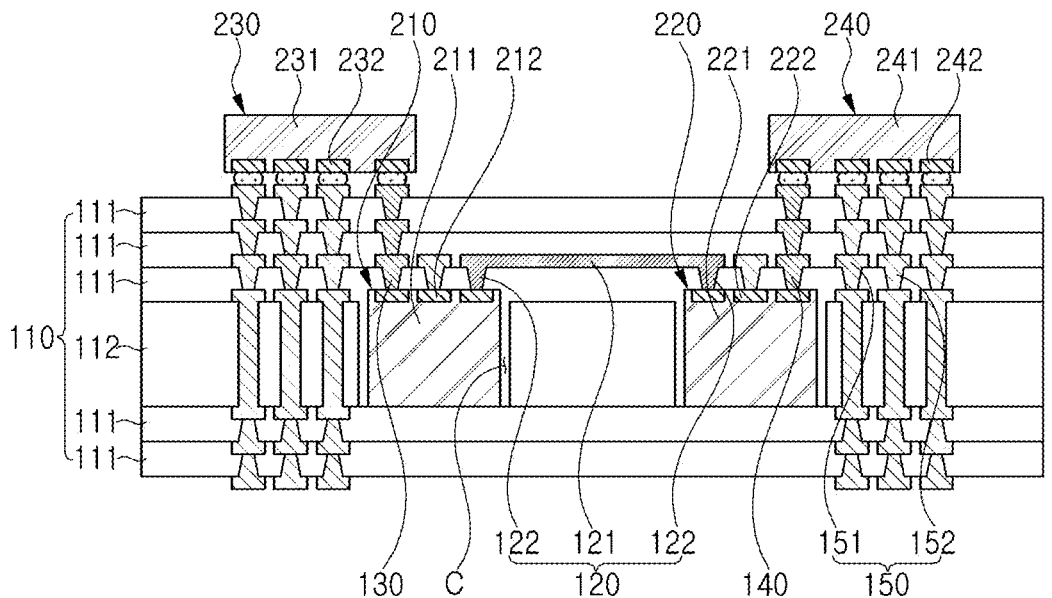

FIGS. 9A and 9B are schematic cross-sectional views of a printed circuit board according to another example.

Referring to FIGS. 9A and 9B, a first semiconductor chip 230 may be disposed directly on a first integrated circuit chip 210 to overlap a portion of the first integrated circuit chip 210. Even in this case, the first semiconductor chip 230 and the first integrated circuit chip 210 may be connected to each other to have a shortest path therebetween, and a second-first via may have a stacked-type via structure. A second semiconductor chip 240 and a second integrated circuit chip 220 may also have the same arrangement, but the present disclosure is not necessarily limited thereto.

A configuration of the printed circuit board according to an example, a configuration of the printed circuit board according to another example, and a configuration of the printed circuit board according to another example, excluding arrangements of the first semiconductor chip 230 and the second semiconductor chip 240, may be applied to the printed circuit board according to another example, and thus a repeated description related thereto will be omitted.

Figure 10A:
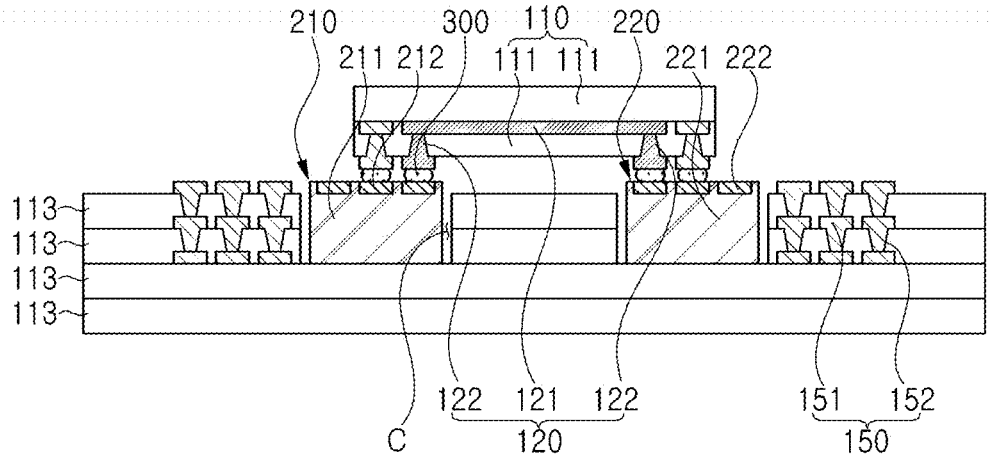
FIGS. 10A and 10B are schematic cross-sectional views of a printed circuit board according to another example.
Figure 10B:
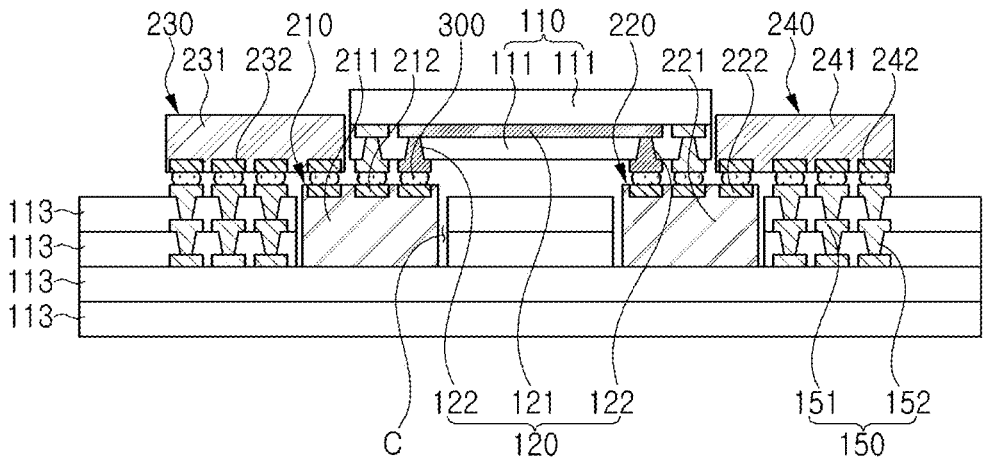

FIGS. 10A and 10B are schematic cross-sectional views of a printed circuit board according to another example.

Referring to FIGS. 10A and 10B, a first insulating portion 110 may be disposed on a first integrated circuit chip 210 and a second integrated circuit chip 220, and may further include a second insulating layer 113 having a cavity C. The second insulating layer 113 may include an insulating material, and the insulating material may be included in a group the same as an insulating material group of a first insulating layer 111, and may include an insulating material the same as that of the first insulating layer 111, but the present disclosure is not necessarily limited thereto. In this case, the second insulating layer 113 may be disposed to be spaced apart from the first insulating layer 111, and a first wiring portion 120, implemented in the first insulating portion 110, may be connected to the first integrated circuit chip 210 and the second integrated circuit chip 220 through a connection member 300.

The printed circuit board according to another example may have an add-on format in which the first wiring portion 120, connecting the first integrated circuit chip 210 and the second integrated circuit chip 220 to each other, has a predetermined structure and is attached on the first integrated chip 210 and the second integrated chip 220. With respect to the first insulating portion 110 connecting the first integrated circuit chip 210 and the second integrated circuit chip 220 to each other, a defect, occurring in the first wiring portion 120 implemented in the first insulating portion 110, may be overcome. As such a structure is enabled, a wiring defect occurring in a connection structure connecting semiconductor chips to each other may be dealt with.

In this case, the first integrated circuit chip 210 and the first semiconductor chip 230 may be directly connected to each other through the connection member 300, and the second integrated circuit chip 220 and the second semiconductor chip 240 may be directly connected to each other through the connection member 300. A semiconductor chip and an integrated circuit chip may be directly connected to each other, and thus a second-first wiring portion 130 and a second-second wiring portion 140 may be omitted, and a rate of a defect that may occur when the semiconductor chip and the integrated circuit chip are connected to each other may be reduced.

In FIGS. 10A and 10B, it is illustrated that the first insulating portion 110 is disposed on the second insulating layer 113, but the present disclosure is not necessarily limited thereto, and the first insulating portion 110 may also be disposed in the cavity C of the second insulating layer 113. In this case, the first integrated circuit chip 210 and the second integrated circuit chip 220 may be disposed on the second insulating layer 113, and the first semiconductor chip 230 and the second semiconductor chip 240 may be disposed in the cavity formed in the second insulating layer 113. Even in this case, the first insulating portion 110 and the first wiring portion 120 may function as a connection structure connecting the first semiconductor chip 230 and the second semiconductor chip 240 to each other.

A configuration of the printed circuit board according to an example, a configuration of the printed circuit board according to another example, and a configuration of the printed circuit board according to another example, excluding an arrangement of the first insulating portion 110 and connection between the semiconductor chip and the integrated circuit chip, may be applied to the printed circuit board according to another example, and thus a repeated description related thereto will be omitted.

As used herein, a cross-sectional shape may refer to a cross-sectional shape of an object when the object is vertically cut, or a cross-sectional shape of the object when the object is viewed in a side-view. In addition, a shape on a plane may be a shape of the object when the object is horizontally cut, or a planar shape of the object when the object is viewed in a top-view or a bottom-view.

As used herein, an upper side, an upper portion, the upper surface, or the like is used to refer to a direction toward a surface on which an electronic component is mountable based on a cross-section of a drawing for ease, and a lower side, a lower portion, a lower surface, or the like is used to refer to an opposite direction thereof. However, the above-described directions are defined for ease of description. Thus, it should be understood that the scope of the claims is not particularly limited by the above-described directions.

As used herein, the term "connected" may not only refer to "directly connected" but also include "indirectly connected" by means of an adhesive layer, or the like. The term "electrically connected" may include both of a case in which components are "physically connected" and a case in which components are "not physically connected." In addition, the terms "first," "second," and the like may be used to distinguish a component from another component, and may not limit a sequence and/or an importance, or others, in relation to the components. In some cases, a first component may be referred to as a second component, and similarly, a second component may be referred to as a first component without departing from the scope of the example embodiments.

As used herein, the term "an example embodiment" is provided to emphasize a particular feature, structure, or characteristic, and do not necessarily refer to the same example embodiment. In addition, the particular characteristics or features may be combined in any suitable manner in one or more example embodiments. For example, a context described in a specific example embodiment may be used in other example embodiments, even if it is not described in the other example embodiments, unless it is described contrary to or inconsistent with the context in the other example embodiments.

The terms used herein describe particular example embodiments only, and the present disclosure is not limited thereby. As used herein, singular forms "a," "an," and "the" are intended to include the plural forms as well, unless the context clearly indicates otherwise.

While example embodiments have been shown and described above, it will be apparent to those skilled in the art that modifications and variations could be made without departing from the scope of the present disclosure as defined by the appended claims.

What is claimed is:

1. A printed circuit board comprising:
a first wiring portion including a plurality of first wirings;
a first integrated circuit chip connected to one side of the first wiring portion, the first integrated circuit chip

16 configured to convert N signals into one signal, wherein N is a natural number;
a second integrated circuit chip connected to an opposite side of the first wiring portion, the second integrated circuit chip configured to convert one signal into N signals;
a second-first wiring portion connected to the first integrated circuit chip, the second-first wiring portion including a plurality of second-first wirings; and
a second-second wiring portion connected to the second integrated circuit chip, the second-second wiring portion including a plurality of second-second wirings,
wherein X and Y1 satisfy Y1/N<X, in which X is the number of the plurality of first wirings and Y1 is the number of the plurality of second-first wirings.

2. The printed circuit board of claim 1, wherein X and Y2 satisfy Y2/N<X, in which Y2 is the number of the plurality of second-second wirings.

3. The printed circuit board of claim 1, wherein at least one wiring, among the plurality of first wirings, is open, such that the first integrated circuit chip and the second integrated circuit chip are not connected to each other through the at least one wiring.

4. The printed circuit board of claim 3, wherein, when X, Y1, and Z satisfy Y1/N≤X-Z, in which Z is the number of open first wirings, among the plurality of first wirings.

5. The printed circuit board of claim 1, wherein, at least two wirings, among the plurality of first wirings, are shorted to each other, such that the shorted wirings does not serve as a path between the first integrated circuit chip and the second integrated circuit chip.

6. The printed circuit board of claim 1, further comprising:
a first insulating portion,
wherein the first wiring portion, the second-first wiring portion, and the second-second wiring portion are respectively disposed on or in the first insulating portion.

7. The printed circuit board of claim 6, wherein the first integrated circuit chip and the second integrated circuit chip are respectively disposed on the first insulating portion.

8. The printed circuit board of claim 6, wherein
the first insulating portion includes a plurality of first insulating layers, and a cavity penetrating at least a portion of the plurality of first insulating layers, and
the first integrated circuit chip is disposed in the cavity.

9. The printed circuit board of claim 8, further comprising:
a connection member connecting the first integrated circuit chip and the second-first wiring portion to each other; and
another connection member connecting the first integrated circuit chip and the first wiring portion to each other.

10. The printed circuit board of claim 6, wherein
the first insulating portion includes a core layer having a through-portion, and
the first integrated circuit chip and the second integrated circuit chip are disposed in the through-portion.

11. The printed circuit board of claim 10, wherein
the first wiring portion includes a plurality of first vias penetrating at least a portion of the first insulating portion to connect the plurality of first wirings and the first integrated circuit chip or the second integrated circuit chip to each other, and
the first integrated circuit chip and the plurality of first wirings, and the second integrated circuit chip and the plurality of first wirings are respectively connected to each other through the first vias.

12. The printed circuit board of claim 1, wherein
the first integrated circuit chip includes a demultiplexer (DEMUX) circuit, and
the second integrated circuit chip includes a multiplexer (MUX) circuit.

13. The printed circuit board of claim 1, further comprising:
a first semiconductor chip connected to the second-first wiring portion; and
a second semiconductor chip connected to the second-second wiring portion.

14. The printed circuit board of claim 13, wherein
the first semiconductor chip and the first integrated circuit chip are connected to each other through the second-first wiring portion to have a shortest path therebetween, and
the second semiconductor chip and the second integrated circuit chip are connected to each other through the second-second wiring portion to have a shortest path therebetween.

15. A printed circuit board comprising:
a first insulating portion including a plurality of first insulating layers, and a plurality of cavities respectively penetrating a portion of the plurality of first insulating layers;
a first integrated circuit chip mounted in one cavity, among the plurality of cavities, the first integrated circuit chip including a demultiplexer (DEMUX) circuit;
a second integrated circuit chip mounted in another cavity, among the plurality of cavities, the second integrated circuit chip including a multiplexer (MUX) circuit;
a second insulating portion disposed across a portion of the first integrated circuit chip and a portion of the second integrated circuit chip; and
a first wiring portion disposed on or in the second insulating portion, the first wiring portion connecting the first integrated circuit chip and the second integrated circuit chip to each other,
wherein the first wiring portion includes a plurality of first wirings, and
at least one wiring, among the plurality of first wirings, is open, or at least two wirings, among the plurality of first wirings, are shorted to each other, such that the open or shorted wirings do not serve as a path between the first integrated circuit chip and the second integrated circuit chip.

16. The printed circuit board of claim 15, further comprising:
a first semiconductor chip disposed across another portion of the first integrated circuit chip and a first portion of the first insulating portion; and
a second semiconductor chip disposed across another portion of the second integrated circuit chip and a second portion of the first insulating portion.

17. A printed circuit board comprising:
a first insulating portion including a plurality of first insulating layers, and a plurality of cavities respectively penetrating a portion of the plurality of first insulating layers;
a first integrated circuit chip disposed in one cavity, among the plurality of cavities;
a second integrated circuit chip disposed in another cavity, among the plurality of cavities;
a second insulating portion disposed across a portion of the first integrated circuit chip and a portion of the second integrated circuit chip; and
a wiring portion disposed on or in the second insulating portion, the wiring portion including a plurality of wirings to connect the first integrated circuit chip and the second integrated circuit chip to each other,
wherein signal transmission between the first integrated circuit chip and the second integrated circuit chip is performed by bypassing a defective wiring among the plurality of wirings to a dummy wiring among the plurality of wirings through lane shifting.

18. The printed circuit board of claim 17, wherein the signal transmission between the first integrated circuit chip and the second integrated circuit chip through other wirings other than the defective wiring among the plurality of wirings is maintained.

19. The printed circuit board of claim 17, wherein one or more wirings among the plurality of wirings are disposed in a region between the defective wiring and the dummy wiring.

20. The printed circuit board of claim 17, wherein
the wiring portion includes a plurality of first vias penetrating at least a portion of the first insulating portion to connect the plurality of wirings and the first integrated circuit chip or the second integrated circuit chip to each other, and
the first integrated circuit chip and the plurality of wirings, and the second integrated circuit chip and the plurality of wirings are respectively connected to each other through the first vias.

\* \* \* \* \*